(12) United States Patent
Hamanaka et al.

(10) Patent No.: US 7,828,152 B2
(45) Date of Patent: Nov. 9, 2010

(54) CARRIER TAPE, ELECTRONIC-COMPONENT ACCOMMODATING MEMBER AND METHOD OF TRANSPORTING ELECTRONIC COMPONENT

(75) Inventors: Yuuzou Hamanaka, Kawasaki (JP); Yukio Ando, Kawasaki (JP); Keiichi Sasamura, Kawasaki (JP); Kenichi Yazaki, Kawasaki (JP); Yuuji Hasegawa, Kawasaki (JP); Kouichi Shinya, Aira (JP)

(73) Assignee: Fujitsu Semiconductor Limited, Yokohama (JP)

( * ) Notice: Subject to any disclaimer, the term of this patent is extended or adjusted under 35 U.S.C. 154(b) by 252 days.

(21) Appl. No.: 12/036,742

(22) Filed: Feb. 25, 2008

(65) Prior Publication Data

US 2008/0202981 A1 Aug. 28, 2008

(30) Foreign Application Priority Data

Feb. 23, 2007 (JP) .............................. 2007-044545

(51) Int. Cl.
*B65D 85/00* (2006.01)
(52) U.S. Cl. ...................................... 206/714; 206/722
(58) Field of Classification Search .................. 206/713, 206/714, 722, 701, 715, 716, 717, 725
See application file for complete search history.

(56) References Cited

U.S. PATENT DOCUMENTS

| | | | |
|---|---|---|---|
| 5,234,104 A * | 8/1993 | Schulte et al. ............... 206/714 |
| 6,216,419 B1 * | 4/2001 | Sakurai ...................... 53/139.5 |
| 6,860,391 B2 * | 3/2005 | Kawada ....................... 206/701 |
| 2003/0085150 A1 * | 5/2003 | Yen .............................. 206/714 |
| 2003/0196930 A1 * | 10/2003 | Agari ........................... 206/714 |
| 2004/0040886 A1 * | 3/2004 | Tellkamp et al. ............. 206/714 |
| 2006/0157382 A1 * | 7/2006 | Yasufuku et al. ............. 206/714 |
| 2008/0296201 A1 * | 12/2008 | Lalouch et al. .............. 206/714 |

FOREIGN PATENT DOCUMENTS

| | | |
|---|---|---|
| JP | 10-157767 A | 6/1998 |
| JP | 2000-229692 A | 2/2000 |
| JP | 2001-261060 A | 9/2001 |

* cited by examiner

*Primary Examiner*—Jacob K Ackun, Jr.
(74) *Attorney, Agent, or Firm*—Westerman, Hattori, Daniels & Adrian, LLP

(57) ABSTRACT

The invention provides carrier tapes in which, when the carrier tapes are wound up, regardless of the positions of accommodating portions of the upper and lower carrier tapes that overlap each other, electronic components accommodated in the accommodating portions can be reliably secured, so that the electronic components can be prevented from becoming dislodged from the accommodating portions; and electronic-component accommodating members including the carrier tapes.

In each carrier tape having the plurality of accommodating portions that accommodate the electronic components and that are formed in a longitudinal direction, a plurality of protrusions are disposed at the bottom surfaces of the accommodating portions, and surfaces of interval portions provided between the accommodating portions that are adjacent to each other are formed lower than surfaces of guides of the carrier tapes.

15 Claims, 14 Drawing Sheets

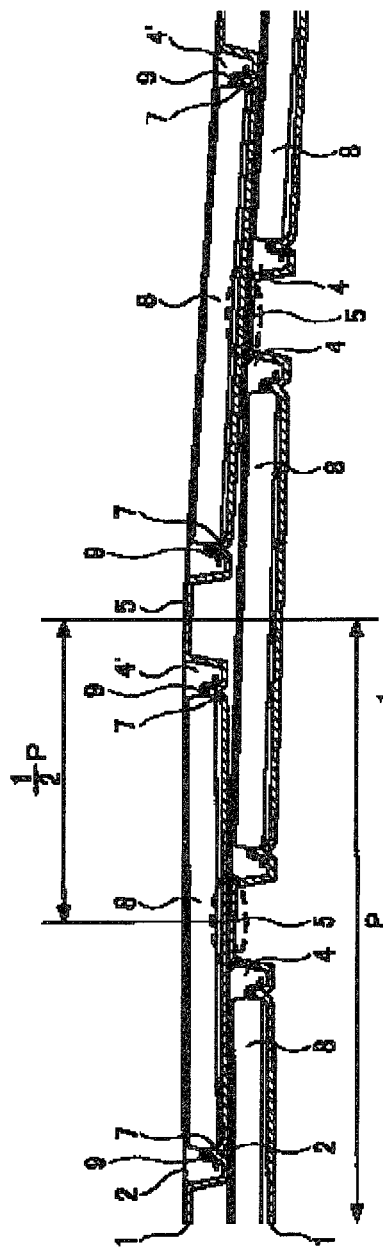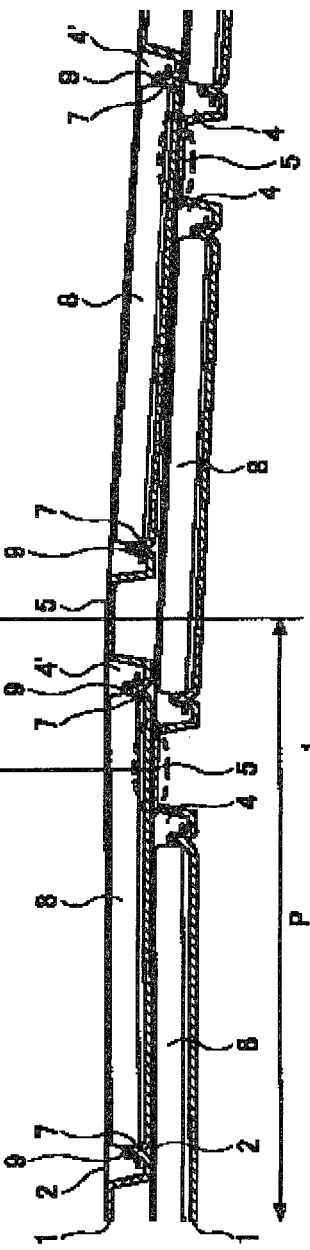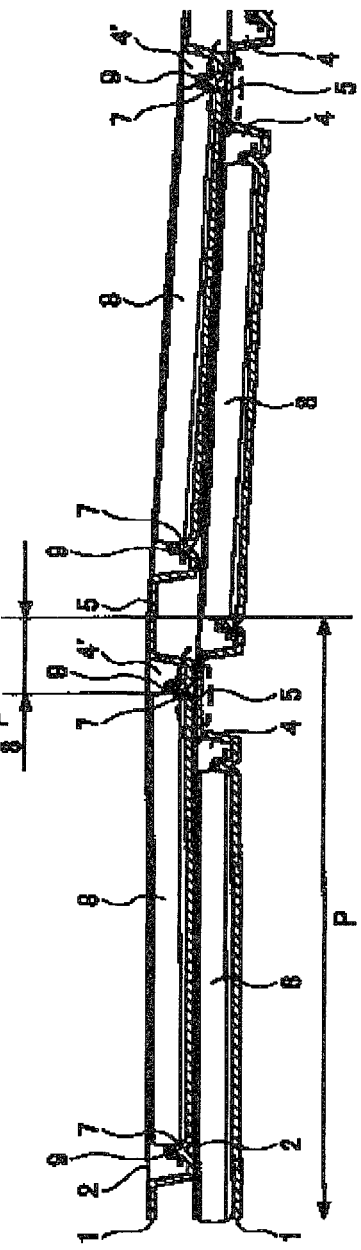

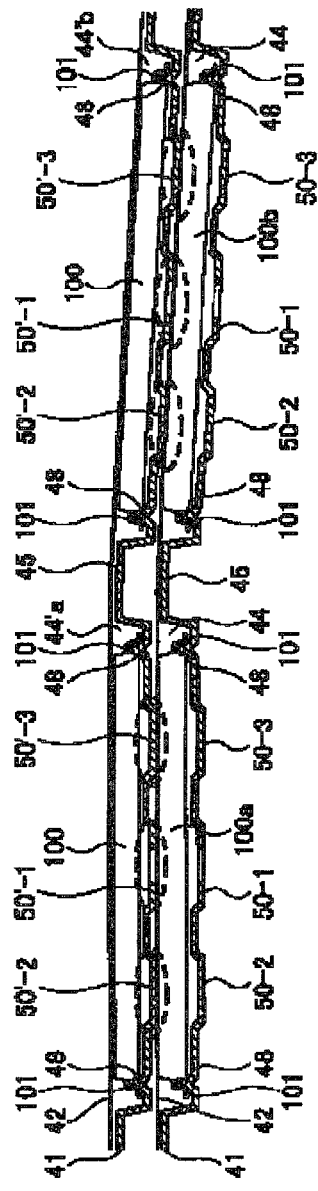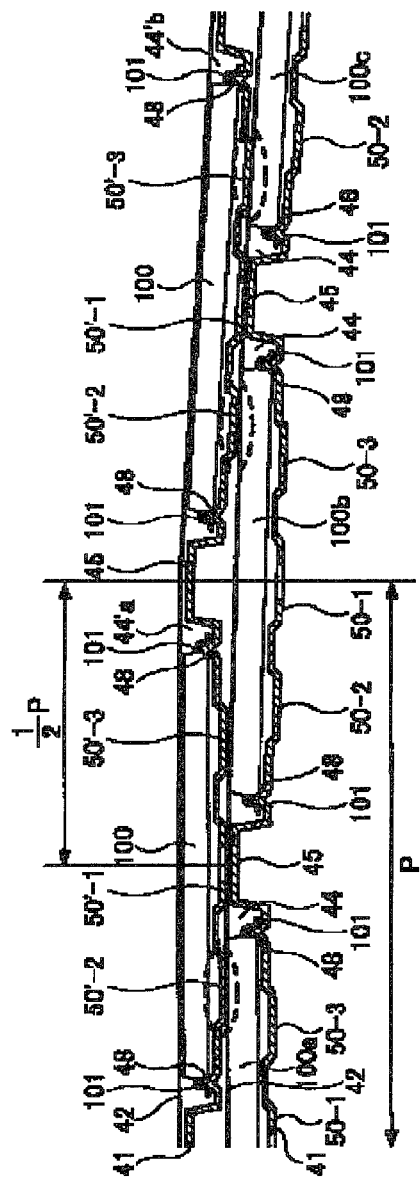
FIG. 10A
FIG. 10B

CARRIER TAPE, ELECTRONIC-COMPONENT ACCOMMODATING MEMBER AND METHOD OF TRANSPORTING ELECTRONIC COMPONENT

TECHNICAL FILED

The present invention relates to a carrier tape, an electronic-component accommodating member including the carrier tape, and a method of transporting an electronic component. More particularly, the present invention relates to a carrier tape that accommodates an electronic component, such as a semiconductor device; an electronic-component accommodating member to which the carrier tape is applied; and a method of transporting the electronic component using the electronic-component accommodating member.

BACKGROUND

In one method of transporting electronic components, such as semiconductor devices, the electronic components are individually accommodated in a carrier tape, called an emboss tape, and are transported.

One reason this method is used is that it is advantageous from the viewpoint of high-speed processing when mounting the electronic components to, for example, a circuit board.

An emboss carrier tape has been proposed. In the emboss carrier tape, a plurality of article accommodating pockets include recessed grooves near the bottom surfaces thereof, and are formed in the longitudinal direction of a tape material so as to be separated by interval portions. Through holes are provided in the interval portions. (Refer to, for example, Japanese Laid-open Patent Application Publication No. 10-157767.)

A component supply tape including a carrier tape and a top tape has been proposed. The carrier tape has a plurality of accommodating portions formed in a longitudinal direction. The top tape covers a surface of the carrier tape, and has recessed portions that are positioned in correspondence with the accommodating portions. The recessed portions engage the inner sides of the accommodating portions and close at least portions of openings of the accommodating portions. (Refer to, for example, Japanese Laid-open Patent Application Publication No. 2001-261060.)

A semiconductor-component taping structure including a carrier tape and a cover tape has been proposed. The carrier tape has a plurality of pockets that individually accommodate semiconductor components. The cover tape covers opening plane sides of the pockets of the carrier tape. Sealing portions are formed on respective sides of a row of the pockets along the direction of arrangement of the pockets.

A protrusion is provided at the sealing portion of one of the carrier tape and the cover tape. A recess into which the protrusion is removably fitted is provided in the other of the carrier tape and the cover tape. (Refer to, for example, Japanese Laid-open Patent Application Publication No. 2000-229692.)

SUMMARY

According to an embodiment, there is provided a carrier tape having a plurality of recessed accommodating portions that accommodate electronic components and that are formed in a longitudinal direction. A plurality of protrusions are disposed at the bottom portions of the accommodating portions so as to protrude in an outward direction of the bottom portions and so as to be separated from each other in the longitudinal direction of the carrier tape. Surfaces of interval portions provided between the accommodating portions are disposed lower than surfaces of both ends of the carrier tape in a transverse direction thereof.

BRIEF DESCRIPTION OF THE DRAWINGS

FIGS. 3A to 3C are sectional views along the longitudinal direction of the carrier tape in states in which the carrier tape shown in FIG. 1 is wound up;

FIGS. 10A and 10B are sectional views along a longitudinal direction of the carrier tape in a state in which the carrier tape shown in FIGS. 5 to 9 is wound up (No. 1);

DESCRIPTION OF THE PREFERRED EMBODIMENT

A preferred embodiment will hereunder be described with reference to FIGS. 1 to 11.

Figure 1:
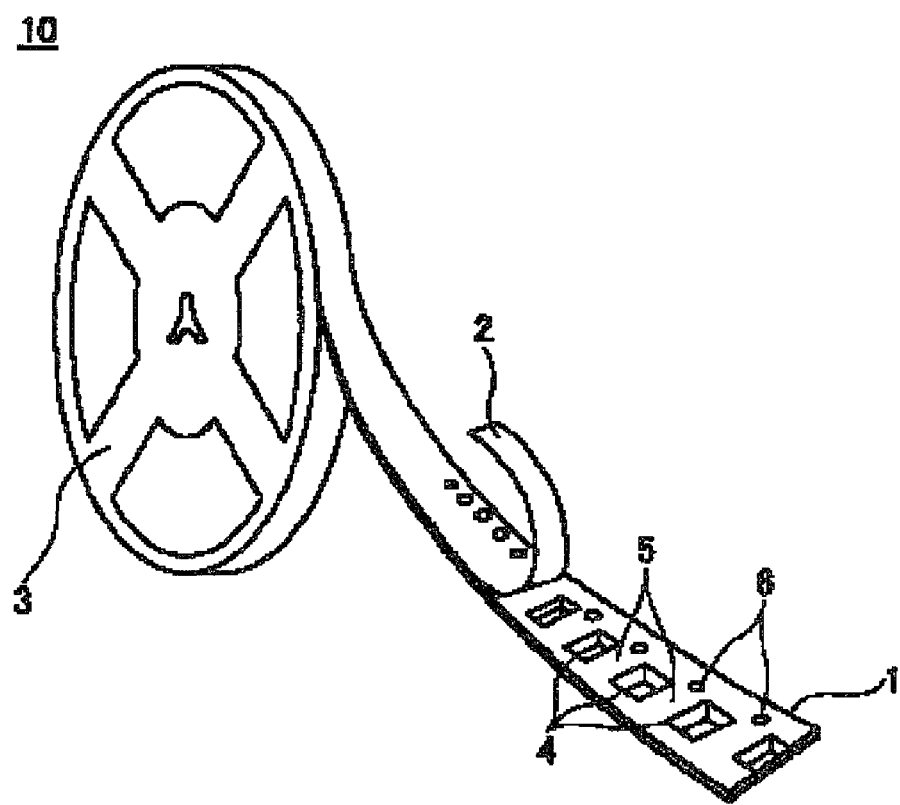
FIG. 1 shows a structure of a related electronic-component accommodating member including a carrier tape.

A structure of a related electronic-component accommodating member to which such a carrier tape is applied is shown in FIG. 1.

Referring to FIG. 1, an electronic-component accommodating member 10 comprises, for example, a carrier tape 1 that receives transportation electronic components that are transported, a cover tape 2 that covers openings in the top surface of the carrier tape 1, and a reel 3 upon which the carrier tape 1 is wound.

The carrier tape 1 is formed of a resinous material in which, for example, carbon powder for taking measures against static electricity is mixed in resin such as polyethylene or vinyl chloride.

Emboss processing (extrusion processing) is performed on the carrier tape 1, so that a plurality of recessed accommodating portions 4 that accommodate the electronic components, such as the semiconductor devices, are provided in the carrier tape 1. The plurality of recessed accommodating portions 4 are disposed at substantially equal intervals in the longitudinal direction of the carrier tape 1 through interval portions 5. In addition, the recessed accommodating portions 4 have, for example, substantially rectangular planar shapes in correspondence with the external shapes of the electronic components that are accommodated.

Transportation feed holes 6 are disposed at a certain interval in one edge or both edges of the carrier tape 1 in a longitudinal direction thereof.

The cover tape 2 has a two-layer structure including, for example, polyethylene terephthalate (PET) resin and polyethylene resin, or olefin resin and polyethylene resin. The cover tape 2 covers the openings in the top surface of the carrier tape 1. The reel 3 is formed of, for example, polystyrene resin.

In a state in which the electronic components, such as the semiconductor devices, are accommodated in the accommodating portions 4 of the carrier tape 1, the cover tape 2 is adhered to the carrier tape 1 so as to cover the accommodating portions 4. The adhesion is performed by, for example, heat sealing or thermal compression bonding using, for example, a press-bonding trowel, so that the electronic components are prevented from falling from the accommodating portions 4.

The carrier tape 1 has mounted thereto the cover tape 2 successively covering the recessed accommodating portions 4 accommodating the respective electronic components, and is wound upon the reel 3, to form the electronic-component accommodating member 10.

In assembling an electronic apparatus, the electronic-component accommodating member 10 is mounted to a component supplying device (not shown). The carrier tape 1 is drawn out from the reel 3, and the feed holes 6 are used to transport the carrier tape 1 to a component supply position with a certain pitch. At this time, the cover tape 2 is peeled off.

At the component supply position, the electronic components, such as the semiconductor devices, are taken out from the accommodating portions 4 of the carrier tape 1, and are mounted/secured to a mounting substrate, such as a mother board, of the electronic apparatus.

Figure 2:
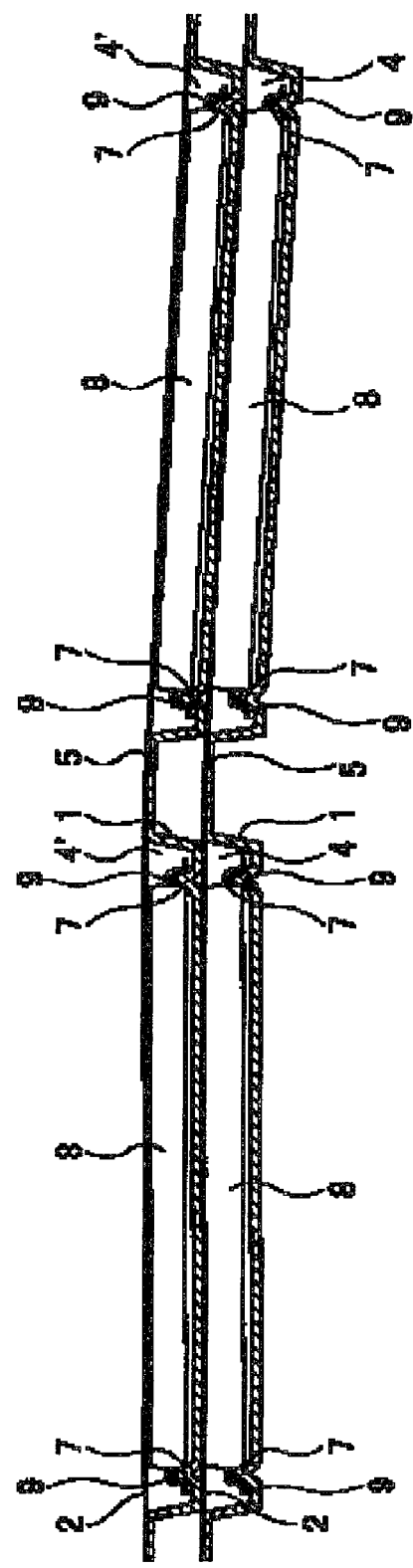
FIG. 2 is a sectional view along a longitudinal direction of the carrier tape in a state in which the carrier tape shown in FIG. 1 is wound up.

FIG. 2 shows a state in which carrier tapes 1 are wound upon and held by reels 3, in such electronic-component accommodating members 10. FIG. 2 is a cross-section in a direction parallel to the longitudinal direction of the carrier tapes 1, that is, to a winding direction thereof.

FIG. 2 shows a case in which the accommodating portions 4 of the wound up and held carrier tape 1 and other accommodation portions 4', positioned at the outer sides of the accommodating portions 4, of the wound up and held carrier tape 1 are situated at substantially corresponding positions in a winding radial direction.

Ribs 7 are provided near side surfaces of the bottom portions of the accommodating portions 4 and 4' in the respective carrier tapes 1 so as to extend parallel with the side surfaces. Electronic components, such as semiconductor devices 8, are accommodated in the individual accommodating portions 4 and 4'. Lead terminals 9 of the semiconductor devices 8 are stopped by the ribs 7, so that the semiconductor devices 8 are supported so as not to contact the bottom portions of the respective accommodating portions 4 and 4'. The ribs 7 are formed, for example, by upwardly bending the bottom portions of the accommodating portions 4 and 4'.

In the example shown in FIG. 2, since the accommodating portions 4 of the carrier tape 1 and the accommodating portions 4', which are positioned above (at the outer sides of) the accommodating portions 4, are situated at the substantially corresponding positions in the winding radial direction, the entire bottom surfaces of the accommodating portions 4' press from above and through a cover tape 2, the semiconductor devices 8 accommodated in the accommodating portions 4 positioned below the accommodating portions 4'.

As a result, unnecessary movements of the semiconductor devices 8 do not occur, so that, for example, unnecessary deformation of the lead terminals 9 of the semiconductor devices 8 does not occur.

As mentioned above, in the electronic-component accommodating members, as the carrier tapes 1 are wound upon the reels 3, the winding is performed with the position of one accommodating portion 4 in the carrier tape 1 differing (being displaced) in the winding radial direction from the position of the accommodating portion 4' that is situated above (at the outer side of) the accommodating portion 4. In this winding up state, the following problems occur.

That is, as the carrier tapes 1 are wound upon the reels 3, as shown in FIG. 3A, the carrier tapes 10 may be wound and held with the accommodating portions 4 of the carrier tape 1 being displaced by ½ pitch (that is, by a length corresponding to half of the dimension of the accommodating portions 4 in the longitudinal direction) from the respective accommodating portions 4' that are positioned above (at the outer side of) the accommodating portions 4. Alternatively, as shown in FIG. 3B, the carrier tapes 10 may be wound and held with the accommodating portions 4 being displaced by ¼ pitch (that is, by a length corresponding to ¼ of the dimension of the accommodating portions 4 in the longitudinal direction) from the respective accommodating portions 4' that are positioned above (at the outer side of) the accommodating portions 4. Still alternatively, as shown in FIG. 3C, the carrier tapes 10 may be wound and held with the accommodating portions 4 being displaced by ⅛ pitch (that is, by a length corresponding to ⅛ of the dimension of the accommodating portions 4 in the longitudinal direction) from the respective accommodating portions 4' that are positioned above (at the outer side of) the accommodating portions 4.

As with FIG. 2, FIGS. 3A to 3C are cross-sections along the longitudinal direction of the carrier tapes 1.

In the cases shown in FIGS. 3A to 3C, as indicated by dotted lines, the lower surfaces of the accommodating portions 4' of the upper (outer-side) carrier tape 1 contact the interval portions 5, provided between the adjacent accommodating portions of the lower (inner-side) carrier tape 1, but are raised in a cantilever manner with the interval portions 5 as fulcra. Therefore, they do not perform a pressing operation in the direction of the semiconductor devices 8 accommodated in the respective accommodating portions 4.

Members that press from above the semiconductor devices 8 accommodated in the lower (inner-side) accommodating portions 4 substantially do not exist.

Therefore, when the carrier tapes 1 are wound upon and held by the reels 3, the semiconductor devices 8 cannot be sufficiently secured in the respective accommodating portions 4.

Consequently, when shock is applied to the electronic-component accommodating member 10, for example, when it falls while being transported, the lead terminals 9 of the semiconductor devices 8, stopped by the ribs 7 in the accommodating portions 4, are dislodged from the ribs 7. Therefore, the semiconductor devices 8 may not be secured in the accommodating portions 4 of the carrier tape 1.

When the semiconductor devices 8 are not secured in the accommodating portions 4, the semiconductor devices 8 become movable. Therefore, the lead terminals 9 of the semiconductor devices 8 can contact the inner-side surfaces of the accommodating portions 4.

As a result, the lead terminals 9 are bent. This makes it difficult or impossible to mount the semiconductor devices 8 to, for example, a wiring substrate.

Figure 4:
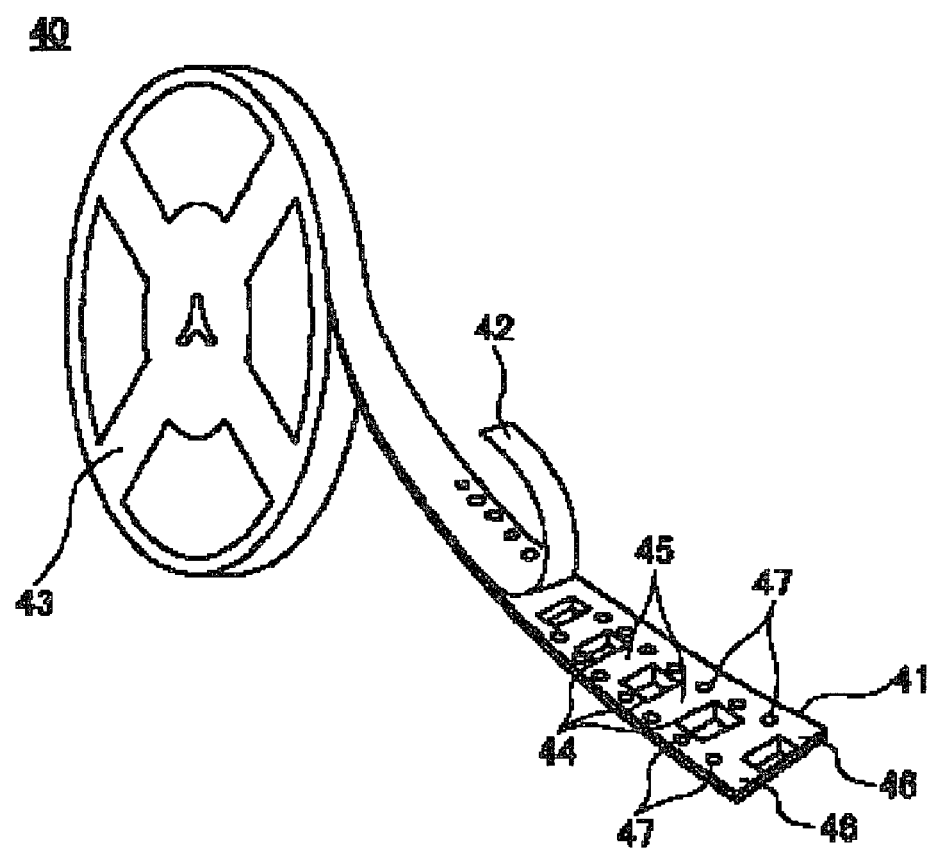
FIG. 4 is an external view of a structure of an electronic-component accommodating member including a carrier tape according to an embodiment of the present invention.

A schematic structure of an electronic-component accommodating member including a carrier tape according to the embodiment is shown in FIG. 4. In the following description, semiconductor devices whose leads are led out in four directions, called Quad Flat Package (QFP) or Low Profile Quad Flat Package (LQFP), are used as exemplary electronic components that are accommodated in the electronic-component accommodating member including the carrier tape according to the embodiment.

An electronic-component accommodating member 40 according to the embodiment is shown in FIG. 4. Referring to FIG. 4, the electronic-component accommodating member 40 according to the embodiment of the comprises a carrier tape 41 that receives/holds transportation electronic components that are transported, a cover tape 42 that covers openings in the top surface of the carrier tape 41, and a reel 43 upon which the carrier tape 41 is wound.

The carrier tape 41 is formed of a resinous material in which, for example, carbon powder for taking measures against static electricity is mixed in resin such as polyethylene, polyvinyl chloride, or a biodegradable plastic sheet.

Emboss processing (extrusion processing) is performed on the carrier tape 41, so that a plurality of recessed accommodating portions 44 that accommodate the electronic components, such as semiconductor devices, are formed in the carrier tape 41. The plurality of recessed accommodating portions 44 are formed at substantially equal intervals in the longitudinal direction of the carrier tape 41 through interval portions 45. In addition, the accommodating portions 44 have, for example, substantially rectangular planar shapes in correspondence with the external shapes of the electronic components that are accommodated.

Transportation feed holes 47 are disposed at a certain pitch (equal interval) in guides 46 on both sides of the carrier tape 41 in a longitudinal direction thereof, that is, in a winding direction thereof. The transportation feed holes 47 may be disposed in the guide 46 at one side of carrier tape 41 in the longitudinal direction thereof.

The cover tape 42 covers the top sides of the accommodating portions 44 of the carrier tape 41, and has a two-layer structure including polyethylene terephthalate (PET) resin and polyethylene resin, or olefin resin and polyethylene resin.

That is, in a state in which the electronic components, such as the semiconductor devices, are accommodated in the accommodating portions 44 of the carrier tape 41, the cover tape 42 is adhered to the carrier tape 41 so as to cover the accommodating portions 44. The adhesion is performed by, for example, heat sealing or thermal compression bonding using, for example, a press-bonding trowel, so that the electronic components are prevented from falling from the accommodating portions 4.

The reel 43 is formed of, for example, polystyrene resin.

The carrier tape 41 has mounted thereto the cover tape 42 successively covering the recessed accommodating portions 44 accommodating the respective electronic components, such as the semiconductor devices, and is wound upon the reel 43, to form the electronic-component accommodating member 40.

In assembling an electronic apparatus, the electronic-component accommodating member 40 is mounted to a component supplying device (not shown).

The carrier tape 41 is drawn out from the reel 43, and the feed holes 47 are used to transport the carrier tape 41 to a component supply position with a certain pitch. At this time, the cover tape 42 is peeled off.

At the component supply position, the electronic components are taken out from the accommodating portions 44, and are mounted/secured to a mounting substrate, such as a mother board, of the electronic apparatus.

Practical Forms

Figure 5:
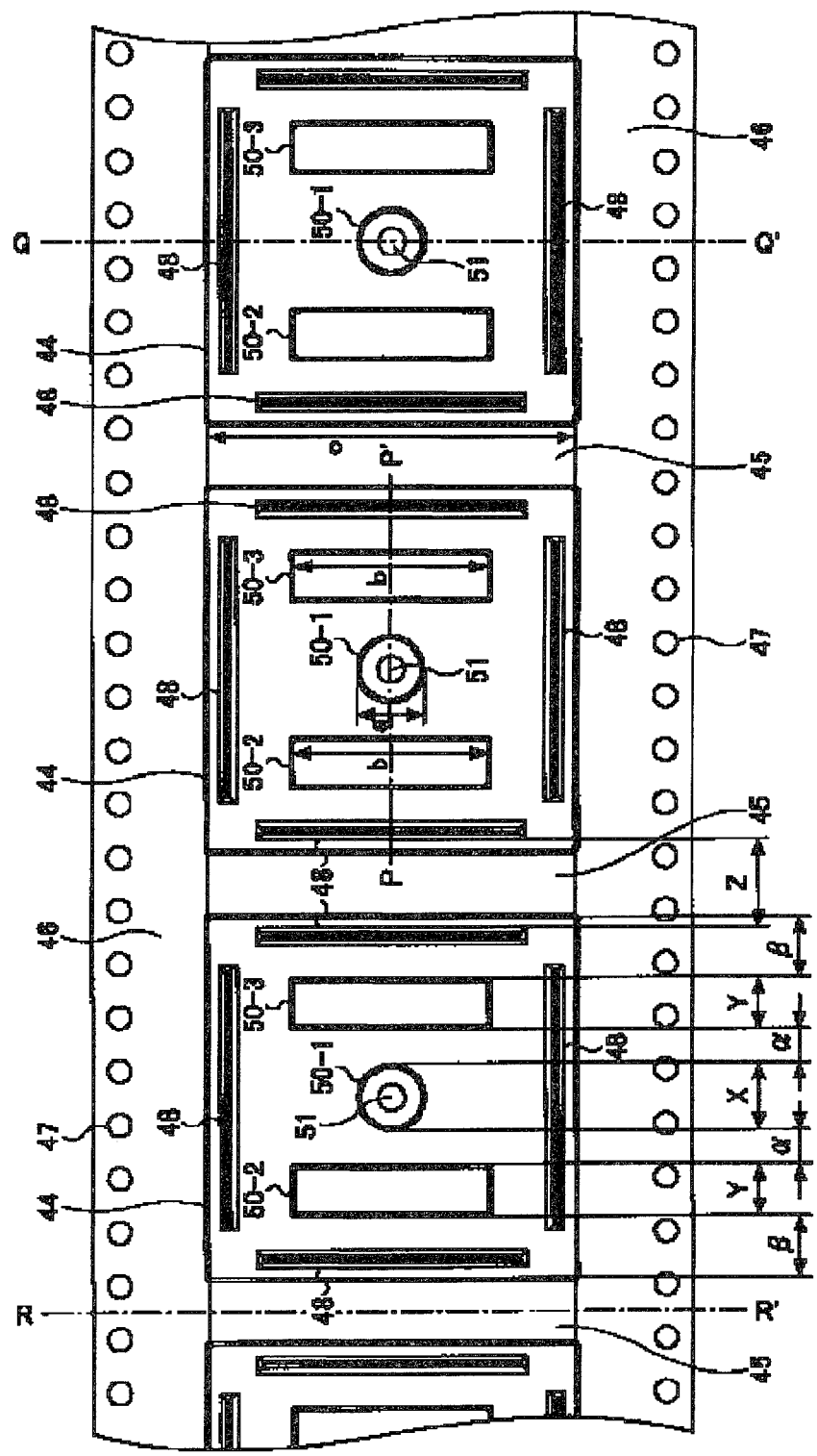
FIG. 5 is a partial plan view of the carrier tape shown in FIG. 4.
Figure 6:
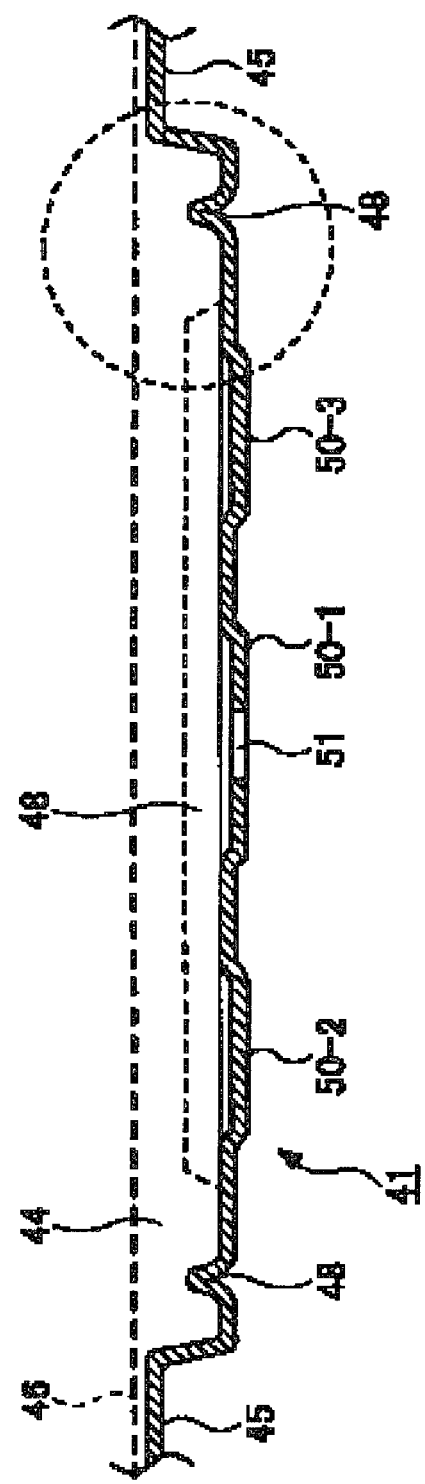
FIG. 6 is a sectional view taken along line P-P' of the carrier tape shown in FIG. 5.
Figure 7:
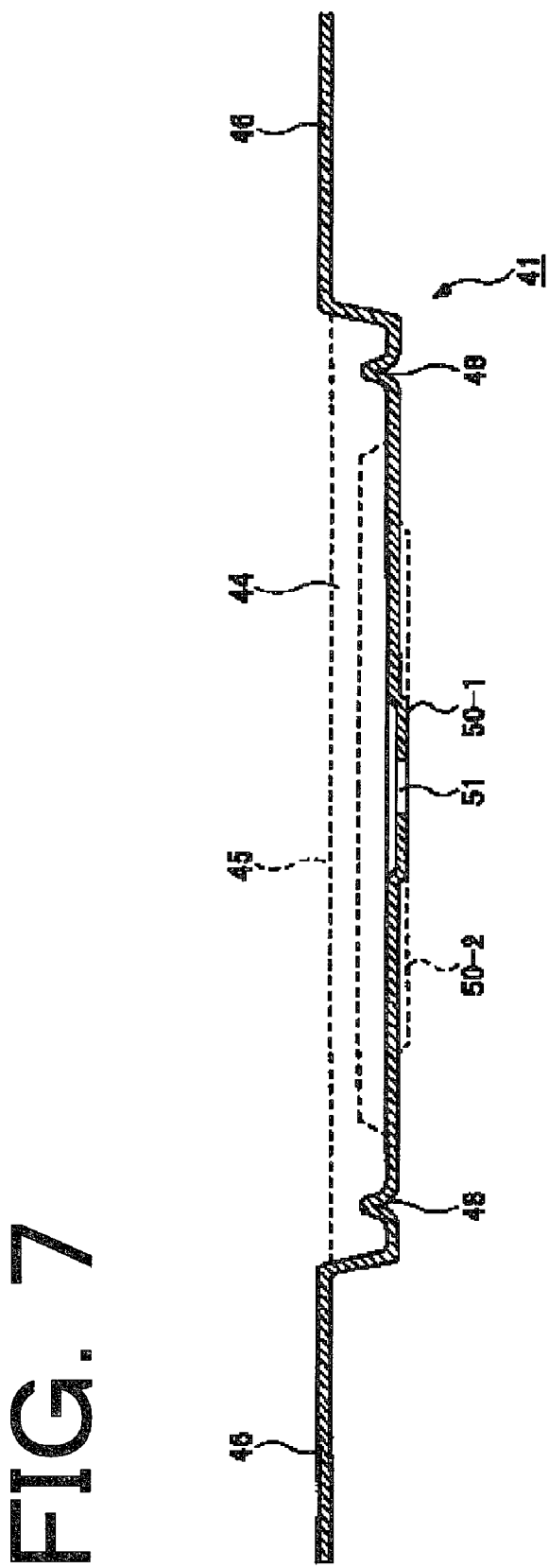
FIG. 7 is a sectional view taken along line Q-Q' of the carrier tape shown in FIG. 5.
Figure 8:
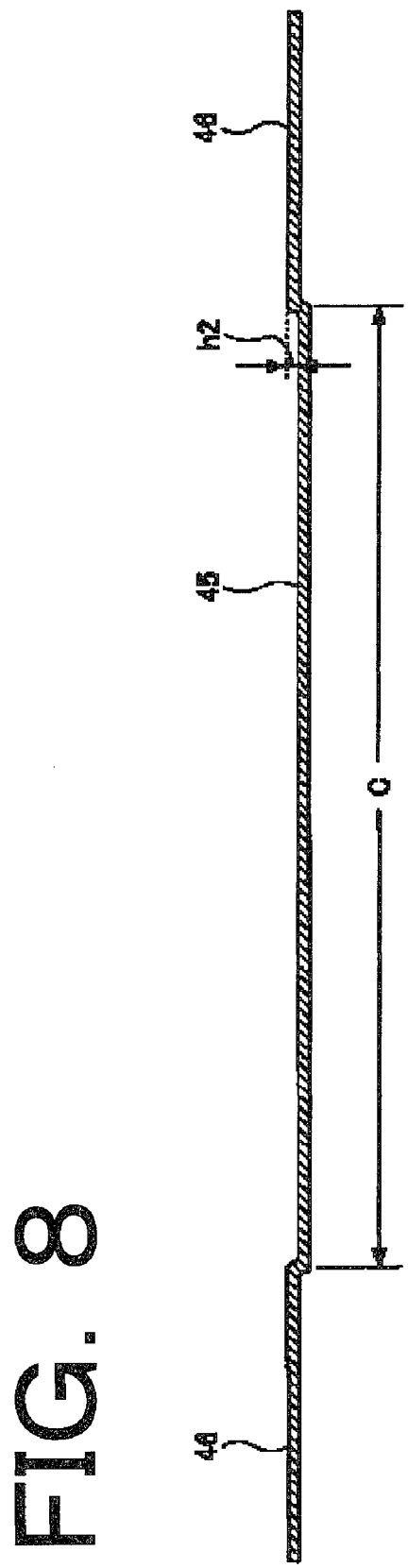
FIG. 8 is a sectional view taken along line R-R' of the carrier tape shown in FIG. 5.

A structure of the carrier tape 41 according to the embodiment will be described in detail with reference to FIGS. 5 to 9. The planar shape of the carrier tape 41 is shown in FIG. 5. A cross-section along line P-P in FIG. 5 is shown in FIG. 6. A cross-section along line Q-Q' in FIG. 5 is shown in FIG. 7. A cross-section along line R-R' in FIG. 5 is shown in FIG. 8. A portion surrounded by dotted lines in FIG. 6 is shown in enlarged form in FIG. 9.

Referring to FIGS. 5 to 8, the carrier tape 41 has a plurality of the recessed electronic-component accommodating portions 44 whose planar shape is rectangular. At the bottom portion of each accommodating portion 44, ribs 48 are disposed near the four sides thereof so as to extend along the respective sides.

Each rib 48 is formed as a result of upwardly bending the bottom portion of the corresponding accommodating portion 44.

In the practical form, each accommodating portion 44 of the carrier tape 41 is used for a semiconductor device whose leads are led out in four directions, called Quad Flat Package (QFP) or Low Profile Quad Flat Package (LQFP). The leads of each semiconductor device are stopped by the ribs 48 so that a body portion (resin sealing portion) of each semiconductor is supported so as not to contact the bottom portion of the corresponding accommodating portion 44.

The characteristic structure of the carrier tape 41 is that, in the bottom portions of the accommodating portions 44, a plurality of protrusions having a predetermined height (depth) are disposed at a predetermined interval in an outward direction of the bottom portions, that is, in a direction away from the electronic components, such as the semiconductor devices, that are accommodated.

More specifically, a first protrusion 50-1 is disposed at substantially the center of the bottom portion of each accommodating portion 44. At both sides (front and back sides) of each first protrusion 50-1, a second protrusion 50-2 and a third protrusion 50-3 are disposed so as to be separated by a predetermined interval, that is, a predetermined distance in a lengthwise direction (longitudinal direction) of the carrier tape 41.

In the practical form, the planar shape of each first protrusion 50-1 is circular. The planar shape of each second protrusion 50-2 and each third protrusion 50-3 is a substantially rectangular shape in which a widthwise direction, that is, a direction perpendicular to the lengthwise direction (longitudinal direction) of the carrier tape 41 corresponds to a long side.

Figure 9:
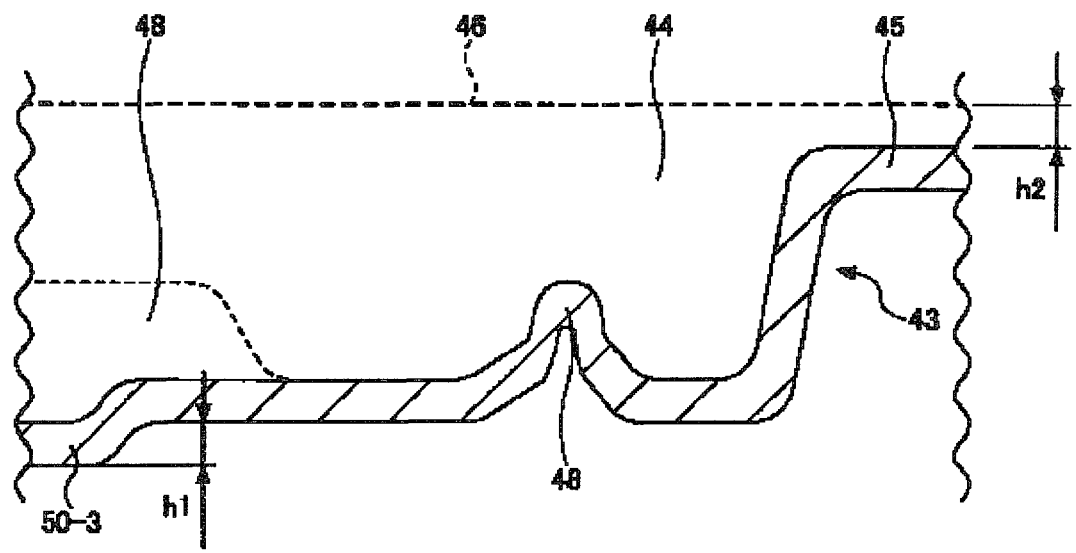
FIG. 9 is an enlarged view of a portion enclosed by dotted lines in FIG. 6.

The first protrusions 50-1, the second protrusions 50-2, and the third protrusions 50-3 are formed so as to protrude by a predetermined dimension h1 from the bottom surfaces of the accommodating portions 44 in the outward direction of the bottom portions of the accommodating portions 44, that is, in the direction away from the electronic components, such as the semiconductor devices, that are accommodated (see FIG. 9).

Referring to FIG. 5, each first protrusion 50-1 has a width of a dimension X in the longitudinal direction of the carrier tape 41. Each second protrusion 50-2 and each third protrusion 50-3 has a width of a dimension Y in the longitudinal direction of the carrier tape 41.

When the carrier tape 41 is wound upon, for example, the reel 43, the first protrusions 50-1, the second protrusions 50-2, and the third protrusions 50-3 (which are disposed so as to be separated from each other in the longitudinal direction of the carrier tape 41) can, along with the interval portions 41 provided between the adjacent accommodating portions 44 in the longitudinal direction of the carrier tape 41, press, through the cover tape 42 and from above, the semiconductor devices 44 accommodated in the accommodating portions 44 that are positioned below (at the inner side of) the first protrusions 50-1, the second protrusions 50-2, and the third protrusions 50-3.

Since the protrusions are disposed so as to be separated from each other in the longitudinal direction of the carrier tape 41, when winding the carrier tape 41 upon the reel 43, the protrusions easily follow deformation of the carrier tape 41, so that any one of the protrusions can press, from above and through the cover tape 42, the semiconductor device that is positioned below (at the inner side of) the protrusion.

As shown in FIG. 8, the top surface of the interval portion 45 between the accommodating portions is set lower by a dimension h2 from the surfaces of the guides 46 where the transportation feed holes 47 of the carrier tape 41 are disposed. In such a structure, a disposition length a of each first protrusion 50-1, and a disposition length b of each second protrusion 50-2 and each third protrusion 50-3 are less than a widthwise dimension c of the interval portions 45 disposed between the accommodating portions 44. That is, c>a and c>b.

Such dimensional relationships result in, when winding up the carrier tape 41, the interval portions 45 serving as guides of the first protrusions 50-1, the second protrusions 50-2, and the third protrusions 50-3 in the accommodating portions 44 that is wound above (at the outer side of) the interval portions, so that the winding can be quickly performed.

When the disposition length a of each first protrusion 50-1 and the disposition length b of each second protrusion 50-2 and each third protrusion 50-3 are greater than the widthwise dimension c of each interval portion 45, even if the first protrusions 50-1, the second protrusions 50-2, and the third protrusions 50-3 of the accommodating portions that are positioned above (at the outer side of) the wound carrier tape 41 are positioned at the accommodating portions 44 positioned below (at the inner sides of) these protrusions, the following occurs. That is, the guides 46 prevent them from falling towards the accommodating portions 44. As a result, the first protrusions 50-1, the second protrusions 50-2, and the third protrusions 50-3 at the upper (outer-side) accommodating portions 44 substantially cannot, through the cover tape 42, press the semiconductor devices in the accommodating portions 44 positioned below (at the inner side of) these protrusions.

By making the disposition length a of each first protrusion 50-1 and the disposition length b of each second protrusion 50-2 and each third protrusion 50-3 large in the range in which the condition (c>a and c>b) is satisfied, when the carrier tape 41 is wound up, areas for pressing the semiconductors accommodated in the accommodating portions positioned directly below (at the inner side of) the first protrusions 50-1, the second protrusions 50-2, and the third protrusions 50-3 are increased.

With a central line (alternate long and short dash line in FIG. 5) of each accommodating portion 44 in the longitudinal direction of the carrier tape 41 serving as a symmetric axis, it is desirable to form the first protrusions 50-1, the second protrusions 50-2, and the third protrusions 50-3 so that the disposition lengths of the carrier tape 41 in the widthwise direction are uniform. By this, when the carrier tape 41 is wound up, uniform pressing forces act upon the semiconductor devices accommodated in the accommodating portions 44 positioned directly below the first protrusions 50-1, the second protrusions 50-2, and the third protrusions 50-3.

In the longitudinal direction of the carrier tape 41, the interval between the first protrusions 50-1 and the respective second protrusions 50-2, and the interval between the first protrusions 50-1 and the respective third protrusions 50-2 are set equal to each other at a dimension In the practical form, a dimension $\beta$ between the second protrusions 50-2 and the interval portions 45 and a dimension $\beta$ between the third protrusions 50-3 and the interval portions 45 are set longer than the dimension $\alpha$ so as to provide areas for forming the ribs 48 at the bottom portions of the accommodating portions 44.

However, it is desirable to set the dimensions $\alpha$ and $\beta 0$ equal to each other due to the following reasons.

That is, if the dimension $\alpha$ between the first protrusions 50-1 and the second protrusions 50-2, the dimension $\alpha$ between the first protrusions 50-1 and the third protrusions 50-3, the dimension $\beta$ between the second protrusions 50-2 and the interval portions 45, and the dimension $\beta$ between the third protrusions 50-3 and the interval portions 45 are set equal to each other, the following is possible. Stated in another way, if the first protrusions 50-1, the second protrusions 50-2, the third protrusions 50-3, and the interval portions 45 are disposed at equal intervals, the following is possible. When the carrier tape 41 is wound upon the reel 43, even if the accommodating portions 44 of an upper (outer-side) carrier tape 41 are displaced in the longitudinal direction (winding direction) from the accommodating portions 44 of a carrier tape 41 positioned directly below (at the inner side of) the upper carrier tape 41, the accommodating portions 44 of the upper (outer-side) tape 41 can reliably press, through the cover tape 42 and using any of the first protrusions 50-1, the second protrusions 50-2, and the third protrusions 50-3, the semiconductor devices accommodated in the accommodating portions 44 of the lower (inner-side) carrier tape 41.

Accordingly, if the interval between the protrusions 50 in the accommodating portions 44 and the interval between the interval portions 45 are set equal to each other, the number of protrusions 50 at the accommodating portions 44 is not particularly limited.

In the practical form, three protrusions, the protrusions 50-1, 50-2, and 50-3, are provided at one accommodating portion. However, if, in the accommodating portion 44, the number of protrusions 50 that are disposed along the lengthwise direction of the carrier tape 41 is increased, when the carrier tape 41 is wound up, the number of pressing locations (pressing points) with respect to the semiconductor devices accommodated in the accommodating portions 44 positioned directly below the protrusions can be increased.

The dimension X of each first protrusion 50-1 in the longitudinal direction of the carrier tape 41 and the dimension Y of each second protrusion 50-2 and each third protrusion 50-3 in the longitudinal direction of the carrier tape 41 may be equal to each other.

By disposing through holes 51 in the first protrusions 50-1, it is possible to detect whether or not an electronic component, such as a semiconductor device, is accommodated in any of the accommodating portions by a sensor provided below the carrier tape 41.

Next, referring to FIGS. 5, 8, and 9, the interval portions 45 provided between the accommodating portions 44 disposed in the longitudinal direction of the carrier tape 43 will be described.

As shown in FIG. 9, the upper surface of the interval portion 45 between the accommodating portions 44 is set lower by the dimension h2 from the surface of the guide 46 where the feed holes 47 for transporting the carrier tape 41 are disposed.

The dimension h2 is set greater than or equal to the protrusion dimension h1 of the protruding portion of the first protrusions 50-1, the second protrusions 50-2, and the third protrusions 50-3. That is, h2≧h1.

When the position h2 of the plane where each interval portion 45 is set is less than the protrusion dimension h1 of each first protrusion 50-1, second protrusion 50-2, and third protrusion 50-3, and when any one of the first protrusions 50-1, the second protrusions 50-2, and the third protrusions 50-3 of the upper (outer-side) carrier tape 41 wound upon the reel 43 is positioned on the interval portion 45 of the lower (inner-side) carrier tape 41, the following occurs. That is, the falling of any one of the first protrusions 50-1, the second protrusions 50-2, and the third protrusions 50-3 that is not positioned on the interval portion 45 into the accommodating portion 44 of the lower (inner-side) carrier tape 41 is prevented or limited, thereby preventing the semiconductor device in the accommodating portion 44 of the lower (inner-side) carrier tape 41 from being pressed through the cover tape 42.

Even if any one of the first protrusions 50-1, the second protrusions 50-2, and the third protrusions 50-3 of the upper (outer-side) carrier tape 41 is positioned at the interval portion 45 of the lower (inner-side) carrier tape 41, making h2≧h1 results in the following. That is, any of the first protrusions 50-1, the second protrusions 50-2, and the third protrusions 50-3 that is not positioned on the interval portion 45 can press, through the cover tape 42, the semiconductor device 100 in the accommodating portion 44 positioned below the protrusion.

Even if any of the first protrusions 50-1, the second protrusions 50-2, and the third protrusions 50-3 of the upper (outer-side) carrier tape 41 is raised in a cantilever manner with the interval portion 45 as a fulcrum, making the position h2 of the plane where the interval portion 45 is set greater than the protrusion height h1 of the first protrusions 50-1, the second protrusions 50-2, and the third protrusions 50-3 results in the following. That is, the raised amount (height) is slight, so that any protrusion disposed far away from the interval portion 45 easily presses the semiconductor device accommodated in the accommodating portion 44 positioned below (at the inner side of) this protrusion.

Referring to FIG. 5, a distance Z between two opposing ribs 48 provided on respective sides of the interval portion 45 is set longer than the width X of each first protrusion 50-1 and the width Y of each second protrusion 50-2 and each third protrusion 50-3. That is, Z >X (Y).

This is because, when the width X of the first protrusions 50-1 and the width Y of the second protrusions 50-2 and the third protrusions 50-3 are set greater than the length Z between two opposing ribs 48 provided on the respective sides of the interval portion 45, the following occurs. That is, when, among the wound-up tapes 41, any one of the first protrusions 50-1, the second protrusions 50-2, and the third protrusions 50-3 of the upper carrier tape 41 is positioned directly above the interval portion 45 of the lower carrier tape 41, the protrusion contacts the interval portion 45. Therefore, the semiconductor device that is accommodated in the accommodating portion 44 of the lower carrier tape 41 cannot be sufficiently pressed through the cover tape 42.

Even if, among the wound up carrier tapes 41, any of the first protrusions 50-1, the second protrusions 50-2, and the third protrusions 50-3 of the upper (outer-side) carrier tape 41 is positioned at the interval portion 45 of the lower (inner-side) carrier tape 41, making Z>X (Y) results in the following. That is, it is possible to prevent the state in which any of the first protrusions 50-1, the second protrusions 50-2, and the third protrusions 50-3 cannot press, through the cover tape 42, the semiconductor device 100 accommodated in the accommodating portion 44 of the lower carrier tape 41.

Next, a state in which the carrier tape 41 having the above-described structure and accommodating the semiconductor devices is wound upon, for example, a reel will be described with reference to FIGS. 10 and 11. Here, FIGS. 10 and 11 are cross-sections of the carrier tape 41 shown in FIGS. 5 and 9 in the longitudinal direction (winding direction) thereof.

FIG. 10A shows a case in which first accommodating portions 44 of the wound-up carrier tape 41 and second accommodating portions 44', positioned directly above (at the outer side of) the first accommodating portions 44, are situated at substantially corresponding positions in the winding radial direction.

Semiconductor devices 100, which are a Quad Flat Package (QFP) type or Low Profile Quad Flat Package (LQFP) type, are accommodated in the respective accommodating portions 44 of the carrier tape 41.

Since the accommodating portions 44 of the carrier tape 41 and the second accommodating portions 44' positioned directly above (at the outer side of) the first accommodating portions 44 are situated at substantially corresponding positions in the winding radial direction, the following occurs. That is, as indicated by portions (elliptical portions) surrounded by broken lines in FIG. 10A, first protrusions 50'-1, second protrusions 50'-2, and third protrusions 50'-3 at respective upper (outer-side) accommodating portions 44'a and accommodating portions 44'b press, through the cover tape 42, semiconductor devices 100a and 100b accommodated in the accommodating portions 44 positioned directly below (at the inner side of) these protrusions.

Therefore, the semiconductor devices 100a and 100b accommodated in the accommodating portions 44 are pressed from thereabove by the first protrusions 50'-1, the second protrusions 50'-2, and the third protrusions 50'-3 of the accommodating portions 44' positioned directly above the semiconductor devices 100a and 100b. In addition, lead terminals 101 of the semiconductor devices 100a and 100b are supported from below by the ribs 48, so that the semiconductor devices 100a and 100b are firmly held in the accommodating portions 44.

FIG. 10B shows a state in which the carrier tapes 41 are wound up with the first accommodating portions 44 of the carrier tape 41 and the second accommodating portions 44', positioned above (at the outer side of) the first accommodating portions 44, being displaced by ½ pitch, that is, by one half of the longitudinal dimension of the accommodating portions 44.

In this state, the second protrusion 50'-2 of the left accommodating portion 44' in the upper (outer-side) carrier tape 41 presses the semiconductor device 100a accommodated in the accommodating portion 44a that is positioned directly below (at the inner side) of the second protrusion 50'-2. In addition, the second protrusion 50'-2 and the third protrusion 50'-3 in the right accommodating portion 44b' of the upper carrier tape 41 press the semiconductor devices 100b and 100c that are positioned directly below the respective second protrusion 50'-2 and third protrusion 50'-3. Further, in the respective accommodating portions 44, the lead terminals 101 of the semiconductor devices 100a, 100b, and 100c are supported by the respective ribs from therebelow, so that the semiconductor devices 100a, 100b, and 100c are held in the respective accommodating portions 44.

Figure 11C:
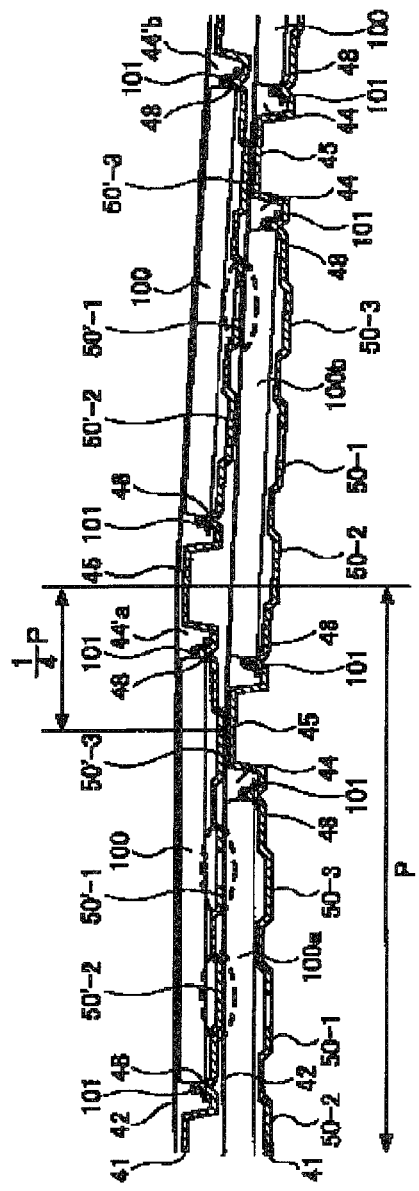
FIGS. 11C and 11D are sectional views along the longitudinal direction of the carrier tape in a state in which the carrier tape shown in FIGS. 5 to 9 is wound up (No. 2)

FIG. 11C shows a state in which the carrier tapes 41 are wound up with the first accommodating portions 44 of the carrier tape 41 and the other accommodating portions 44', positioned above (at the outer side of) the first accommodating portions 44, being displaced by ¼ pitch, that is, by ¼ of the longitudinal dimension of the accommodating portions 44.

In this state, the second protrusion 50'-2 and the first protrusion 50'-1 of the left accommodating portion 44' a in the upper (outer-side) carrier tape 41 press the semiconductor device 100a accommodated in the accommodating portion 44a that is positioned directly below (at the inner side) of the second protrusion 50'-2 and the first protrusion 50'-1. In addition, the first protrusion 50'-l of the right accommodating portion 44'b of the upper carrier tape 41 presses the semiconductor device 100b accommodated in the accommodating portion 44b that is positioned directly below the first protrusion 50'-1. Further, in the respective accommodating portions 44, the lead terminals 101 of the semiconductor devices 100a and 100b are supported by the respective ribs 48 from therebelow, so that the semiconductor devices 100a and 100b are held in the respective accommodating portions 44.

Figure 11D:
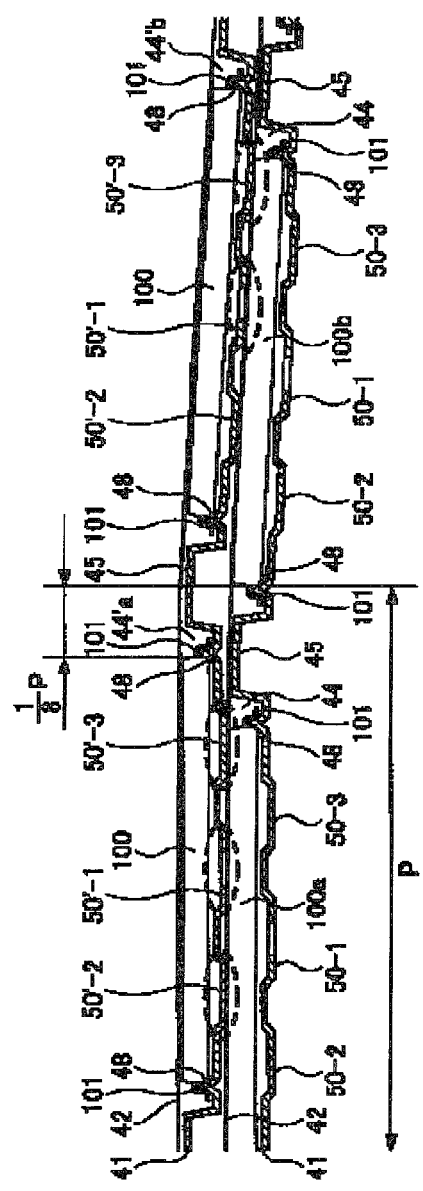

FIG. 11D shows a state in which the carrier tapes 41 are wound up with one accommodating portion 44 of the carrier tape 41 and another accommodating portion 44', positioned above (at the outer side of) the first accommodating portion 44, being displaced by ⅛ pitch, that is, by ⅛ of the longitudinal dimension of the accommodating portion 44.

In this state, the first protrusion 50'-1, the second protrusion 50'-2, and the third protrusion 50'-3 at the left accommodating portion 44'a of the upper (outer-side) carrier tape 41 press the semiconductor device 100a accommodated in the accommodating portion 44a that is positioned directly below (at the inner side) of the first protrusion 50'-1, the second protrusion 50'-2, and the third protrusion 50'-3. In addition, the first protrusion 50'-1 and the third protrusion 50'-3 of the right accommodating portion 44'b of the upper carrier tape 41 press the semiconductor device 100b accommodated in the accommodating portion 44b that is positioned directly below the first protrusion 50'-1 and the third protrusion 50'-3. Further, in the respective accommodating portions 44, the lead terminals 101 of the semiconductor devices 100a and 100b are supported by the respective ribs 48 from therebelow, so that the semiconductor devices 100a and 100b are held in the respective accommodating portions 44.

In such a winding state, the surfaces of the interval portions 45 are disposed below by h2 from the positions of both edges of each carrier tape 41 in the longitudinal direction. Therefore, it is possible to overcome the problem that a pressing force is not provided in the direction of the semiconductor devices 100, accommodated in the lower (inner-side) accommodating portions 44, due to the accommodating portions 44 being raised in a cantilever manner with the interval portions 45 as fulcra.

Accordingly, even if the carrier tapes 41 are wound up with the first accommodating portions 44 of the carrier tapes 41 and the other accommodating portion 44' above (at the outer side) of the first accommodating portions 44 being shifted from each other in the longitudinal direction of the carrier tapes 41, the following occurs. That is, the first protrusions 50'-1, the second protrusions 50'-2, and the third protrusions 50'-3 effectively press, from above and along with the interval portions 45 (provided between the respective adjacent accommodating portions 44 in the longitudinal direction of the carrier tapes 41), the semiconductor devices 100 accommodated in the accommodating portions 44 that are positioned directly below (at the inner side of) the first protrusions 50-1, the second protrusions 50-2, and the third protrusions 50-3.

Further, the lead terminals 101 of the semiconductor devices 100 are supported by the ribs 48 from therebelow, so that the semiconductor devices 100 are secured and firmly held in the respective accommodating portions 44.

According to the embodiment, there is provided an electronic-component accommodating member including a carrier tape having a plurality of recessed accommodating portions that accommodate electronic components and that are formed in a longitudinal direction, electronic components that are accommodated in the accommodating portions, a cover tape that covers the accommodating portions of the carrier tape, and a reel upon which the carrier tape is wound up. A plurality of protrusions are disposed at the bottom portions of the accommodating portions of the carrier tape so as to protrude in an outward direction of the bottom portions and so as to be separated from each other in the longitudinal direction of the carrier tape. Surfaces of interval portions provided between the accommodating portions are disposed lower than surfaces of both ends of the carrier tape in a transverse direction thereof.

According to the embodiment, the semiconductor devices 100 accommodated in the respective accommodating portions 44 can be reliably secured from above and below the semiconductor devices 100, regardless of the positional relationship between the accommodating portions 44 of the lower (inner-side) carrier tape 41 and the accommodating portions 44 of the upper (outer-side) carrier tape 41 when winding up the carrier tapes 41 upon the reels 43.

Consequently, even if shock is applied to the electronic-component accommodating members 40 including the carrier tapes 41, when, for example, they fall while being transported, it is possible to overcome the problem that the semiconductor devices 100 become movable in the respective accommodating portions 44 as a result of the lead terminals 101 of the semiconductor devices 100 accommodated in the accommodating portions 44 becoming dislodged from the ribs 48.

That is, it is possible to prevent the problem that the lead terminals 101 of the semiconductor devices 100 become bent due to the lead terminals 101 of the semiconductor devices 100 contacting the inner surfaces of the accommodating portions 44. Therefore, even if the semiconductor devices are of relatively large types, such as the aforementioned Quad Flat Package (QFP) or Low Profile Quad Flat Package (LQFP), and have lead terminals disposed in four directions, the lead terminals are not deformed when the semiconductor devices are being transported.

This makes it possible for the semiconductor devices to be efficiently mounted to a mounting substrate in an electronic apparatus.

The embodiment includes the following steps when transporting an electronic component to, for example, a component supplying device using the electronic component accommodating member and the carrier tape.

They are the step of accommodating electronic components in accommodating portions of the carrier tape including the accommodating portions that accommodate the electronic components in the longitudinal direction; the step of covering the accommodating portions of the carrier tape with a cover tape; the step of forming an electronic-component accommodating member as a result of winding the carrier tape covered with the cover tape upon a reel so that the accommodating portions are disposed at the inner side; and the step of transporting the electronic-component accommodating member to, for example, the component supplying device.

Here, in accordance with the idea of the embodiment, a plurality of protrusions are disposed at the bottom portions of the electronic-component accommodating portions of the carrier tape so as to protrude in the outward direction of the bottom portions and so as to be separated from each other in the longitudinal direction of the carrier tape. In addition, the surfaces of interval portions, provided between the accommodating portions, are disposed lower than guides of the carrier tape.

According to the embodiment, there is provided a method of transporting electronic components including the step of accommodating the electronic components in accommodating portions of a carrier tape, the accommodating portions accommodating the electronic components and being formed in a longitudinal direction; the step of covering the accommodating portions of the carrier tape with a cover tape; the step of forming an electronic-component accommodating member as a result of winding the carrier tape covered with the cover tape upon a reel so that the accommodating portions are at the inner side; and the step of transporting the electronic-component accommodating member. A plurality of protrusions are disposed at the bottom portions of the accommodating portions of the carrier tape so as to protrude in an outward direction of the bottom portions and so as to be separated from each other in the longitudinal direction of the carrier tape. Surfaces of interval portions provided between the accommodating portions are disposed lower than surfaces of both ends of the carrier tape in a transverse direction thereof.

According to such a method of transporting electronic components, the characteristic structure of the carrier tape makes it possible to transport with high reliability the electronic components, such as semiconductor devices, accommodated in the accommodating portions of the carrier tape, without, for example, deforming the lead terminals of the electronic components.

Therefore, an electronic apparatus can be manufactured with high working efficiency using the electronic components.

Although an embodiment of the present invention is described in detail, the idea of the present invention is not limited to the embodiment, so that various modifications or changes can be made.

For example, in the embodiment, the first protrusions 50-1 have substantially circular planar shapes, and the second protrusions 50-2 and the third protrusions 50-3 have rectangular planar shapes having a long side in the widthwise direction of the carrier tape 41.

However, the shapes of these protrusions are not limited thereto. That is, the protrusions are formed so as to satisfy the following conditions:

(1) They are formed so as to protrude by the predetermined dimension h1 from the bottom surfaces of the accommodating portions 44 in the outward direction of the bottom portions of the accommodating portions 44, that is, in the direction away from the electronic components, such as the semiconductor devices, that are accommodated;

(2) The interval α between the first protrusion 50-1 and the second protrusion 50-2 and the interval α between the first protrusion 50-1 and the third protrusion 50-3 are set equal to the interval β between the second protrusion 50-2 and the interval portion 45 and between the interval portion 45 and the third protrusion 50-3 (α=β in FIG. 5);

(3) The upper surfaces of the interval portions 45 are set lower by the dimension h2 from the surfaces of the guides 46 where the feed holes 47 for transporting the carrier tape 41 are disposed (the dimension h2 is set greater than or equal to the dimension h1 (h2≧h1));

(4) The distance Z between two facing ribs 48 provided on both sides of the corresponding interval portion 45 is set greater than the width X of the first protrusion 50-1 and the width Y of the second protrusion 50-2 and the third protrusion 50-3 (Z>X (Y) in FIG. 5); and (5) The disposition length a of the first protrusion 50-1 and the disposition length b of the second protrusion 50-2 and the third protrusion 50-3 in the widthwise direction of the carrier tape 41 is set less than the width c of the interval portion 45 (c>a (b) in FIG. 5).

Figure 12:
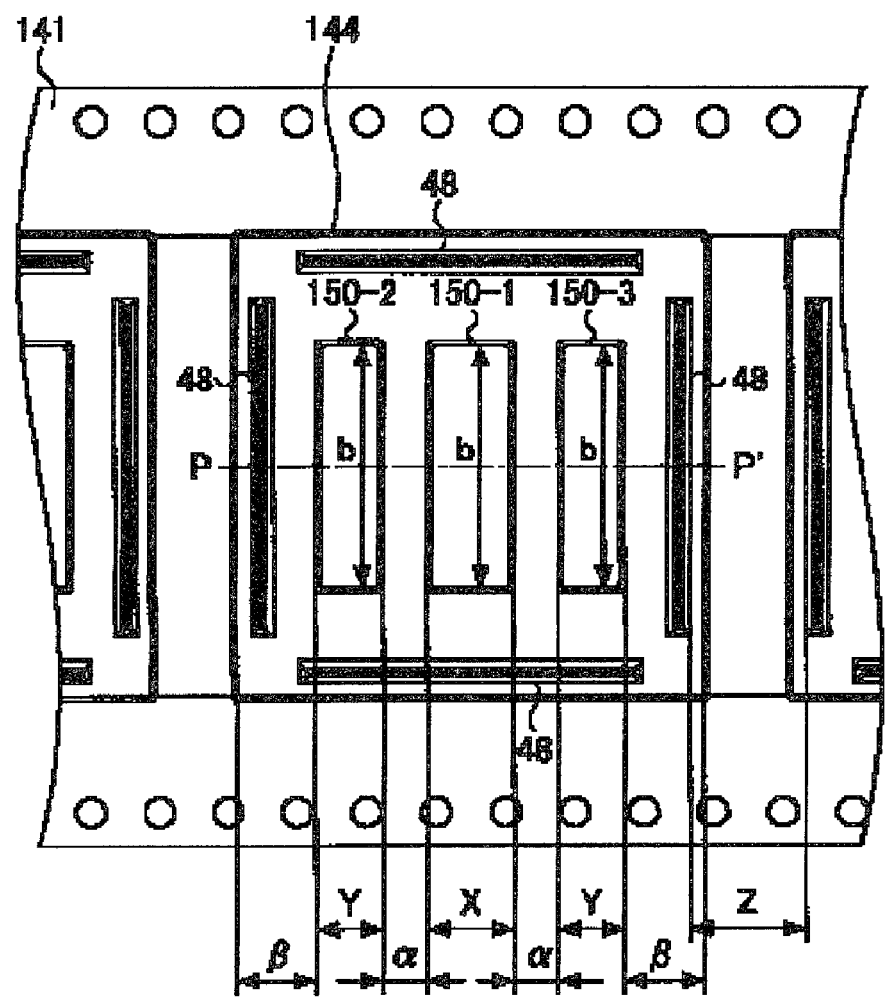
FIG. 12 is a partial enlarged plan view of a first modification of the carrier tape shown in FIG. 5.
Figure 13:
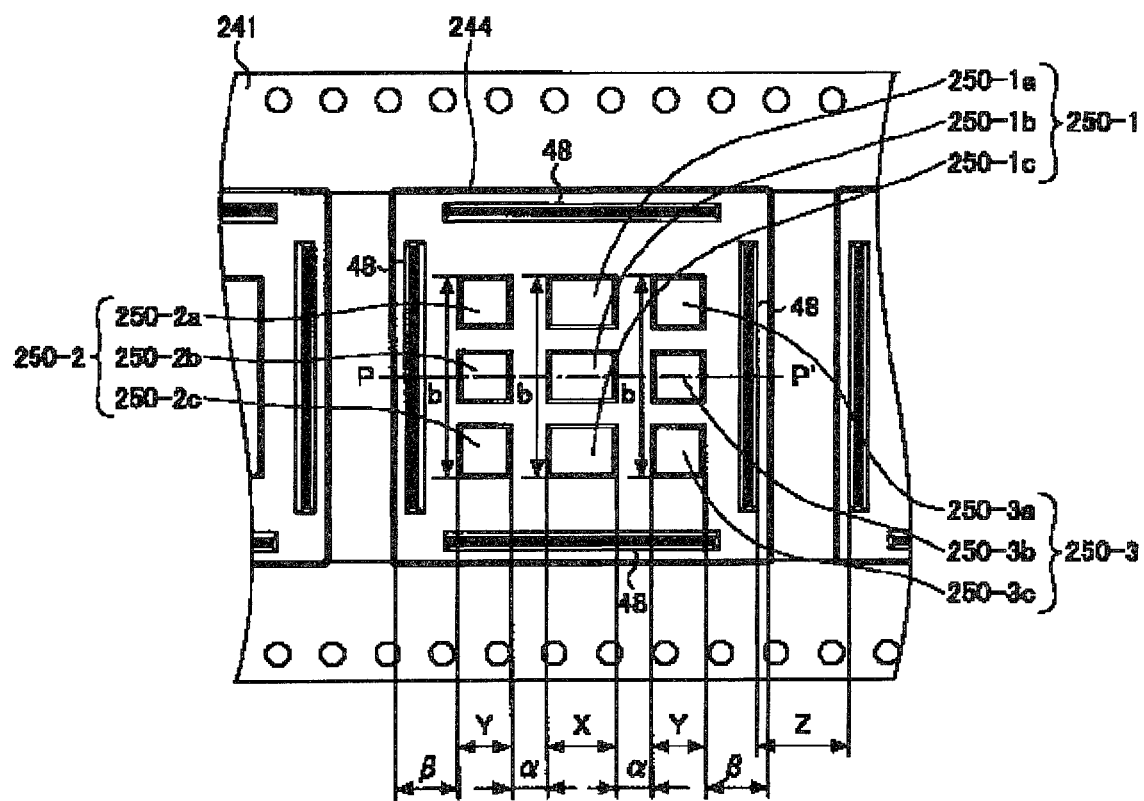
FIG. 13 is a partial enlarged plan view of a second modification of the carrier tape shown in FIG. 5.
Figure 14:
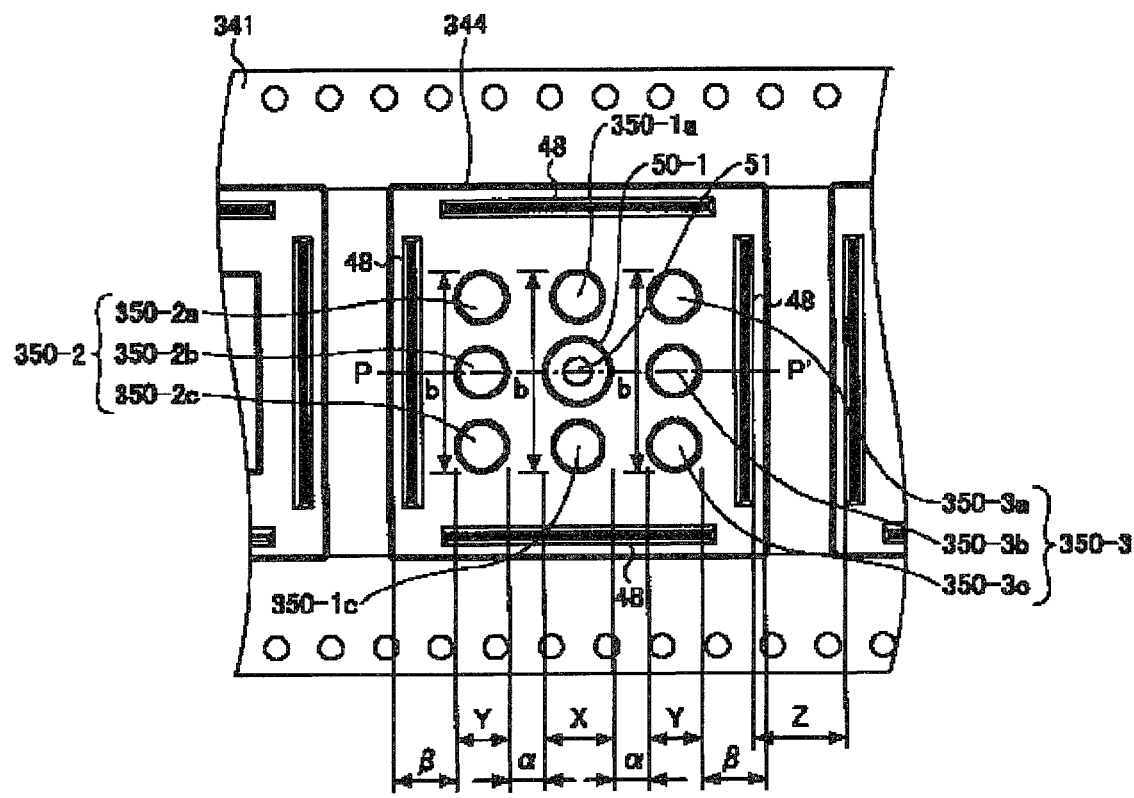
FIG. 14 is a partial enlarged plan view of a third modification of the carrier tape shown in FIG. 5.

Therefore, the first protrusion 50-1, the second protrusion 50-2, and the third protrusion 50-3 may have, for example, planar shapes shown in FIGS. 12 to 14.

In FIGS. 12 to 14, one accommodating portion of a carrier tape is shown, and corresponding portions to those shown in FIG. 5 are given the same reference numerals and will not be described below.

In a carrier tape 141 shown in FIG. 12, as with the planar shape of a second protrusion 150-2 and a third protrusion 150-3, the planar shape of a first protrusion 150-1 disposed at the bottom portion of an accommodating portion 144 is a substantially rectangular shape having a long side in the widthwise direction of the carrier tape 141. That is, the dimension of the first protrusion 150-1 in the lengthwise direction (longitudinal direction) of the carrier tape 141 is set to a length X corresponding to the diameter of the circular shape in FIG. 5. In addition, the disposition length of the first protrusion 150-1 in the widthwise direction of the carrier tape 141 is set equal to b, which is equal to the disposition lengths of the second protrusion 150-2 and the third protrusion 150-3.

The dimension of the second protrusion 150-2 and the third protrusion 150-3 in the lengthwise direction (longitudinal direction) of the carrier tape 141 is set to Y.

Even in this form, the Conditions (1) to (5) are satisfied as in the practical form shown in FIG. 5.

In a carrier tape 241 shown in FIG. 13, the protrusions shown in FIG. 12, that is, the first protrusion 150-1, the second protrusion 150-2, and the third protrusion 150-3 are divided into a plurality of portions (here, three portions) in the widthwise direction of the carrier tape 241, to form first protruding portions 250-1a to 250-1c, second protruding portions 250-2a to 250-2c, and third protruding portions 250-3a to 250-3c.

That is, a first protrusion 250-1 is formed at the bottom portion of an accommodating portion 244 by the rectangular protruding portions 250-1a, 250-1b, and 250-1c. In addition, a second protrusion 250-2 is formed by the rectangular protruding portions 250-2a, 250-2b, and 250-2c. Further, a third protrusion 250-3 is formed by the rectangular protruding portions 250-3a, 250-3b, and 250-3c.

The dimension of the first protrusion 250-1 in the lengthwise direction (longitudinal direction) of the carrier tape 241 is set to X. In addition, the dimension of the second protrusion 250-2 and that of the third protrusion 250-3 in the lengthwise direction (longitudinal direction) of the carrier tape 141 are set to Y.

The maximum lengths of the first protrusion 250-1, the second protrusion 250-2, and the third protrusion 250-3 in the widthwise direction of the carrier tape 141 are set to b.

Even in this form, the Conditions (1) to (5) are satisfied as in the practical form shown in FIG. 5.

In a carrier tape 341 shown in FIG. 14, the nine rectangular protruding portions in the form shown in FIG. 13 are circular.

That is, at the bottom portion of an accommodating portion 344, a second protrusion 350-2 is formed by circular protruding portions 350-2a, 350-2b, and 350-2c, and a third protrusion 350-3 is formed by circular protruding portions 350-3a, 350-3b, and 350-3c. A first protrusion 50-1 is disposed between protruding portions 350-1a and 350-1c.

The dimension of the first protrusion 50-1 in the lengthwise direction (longitudinal direction) of the carrier tape 341 is set to X. The dimension of the second protrusion 350-2 and that of the third protrusion 350-3 in the lengthwise direction (longitudinal direction) of the carrier tape 341 is set to Y.

The maximum lengths of the first protrusion 350-1, the second protrusion 350-2, and the third protrusion 350-3 in the widthwise direction of the carrier tape 341 are set to b.

As the first protrusion 350-1, the first protrusion 50-1 having a through hole 51 is disposed.

Even in this form, the Conditions (1) to (5) are satisfied as in the practical form shown in FIG. 5.

The cross-sectional shapes along lines P-P' in the accommodating portions 144, 244, and 344 of the respective carrier tapes 141, 241, and 341 shown in FIGS. 12 to 14 are the same as the cross-sectional shape shown in FIG. 6.

Even in each of the forms shown in FIGS. 12 to 14, when each of the carrier tapes 141, 241, and 341 is wound up, the following is possible. That is, regardless of the relationship between the positions of accommodating portions of respective upper and lower carrier tapes that overlap each other, electronic components, such as semiconductor devices, accommodated in the accommodating portions are reliably secured to prevent the electronic components from being movable in the accommodating portions.

In the practical forms, a semiconductor device having leads lead out in four directions, called a Quad Flat Package (QFP) type or a Low Profile Quad Flat Package (LQFP) type semiconductor device, is used as an example of an electronic component that is accommodated. Obviously, the carrier tape, the electronic-component accommodating member, and the method of transporting an electronic component are applicable not only to a semiconductor device.

The embodiment is applicable to a carrier tape including an electronic-component accommodating portion formed by emboss processing, an electronic-component accommodating member to which the carrier tape is applied, and a method of transporting an electronic component using the electronic-component accommodating member, regardless of the form by which leads of the electronic component are led out.

The embodiment provides carrier tapes which can prevent movement of electronic components in accommodating portions as a result of reliably pressing the electronic components accommodated in the accommodating portions, regardless of the positions of the upper and lower (outer-side and inner-side) accommodating portions that overlap each other, when the carrier tapes are wound upon and held by reels; and electronic-component accommodating members that accommodate/hold the electronic components using the carrier tapes.

Further, the embodiment provides a method of transporting electronic components using the electronic-component accommodating members.

What is claimed is:

1. A carrier tape having a plurality of recessed accommodating portions that accommodate electronic components and that are formed in a longitudinal direction,
    wherein a plurality of protrusions are disposed at the bottom portions of the accommodating portions so as to protrude in an outward direction of the bottom portions and so as to be separated from each other in the longitudinal direction of the carrier tape,
    wherein surfaces of interval portions provided between the accommodating portions are disposed lower than surfaces of both ends of the carrier tape in a transverse direction thereof, and
    wherein the plurality of protrusions include first protrusions and second protrusions, each first protrusion being formed in the center of the corresponding accommodating portion, the second protrusions being formed on the left and right of the corresponding first protrusion in the longitudinal direction of the carrier tape.

2. The carrier tape according to claim 1, wherein the length of each first protrusion in a widthwise direction of the carrier tape and the length of each second protrusion in the widthwise direction of the carrier tape are shorter than the length of each interval portion in the widthwise direction of the carrier tape.

3. The carrier tape according to claim 1, wherein the lengths in the widthwise direction of the carrier tape of the second protrusions that are adjacent to each other are uniform so as to uniformly press the electronic component in the accommodating portion by the second protrusions.

4. The carrier tape according to claim 1, wherein the second protrusions are arranged between the first protrusions and the interval portions so as to press the electronic component in the accommodating portion by the first or the second protrusions, when the carrier tape is wound up.

5. A carrier tape having a plurality of recessed accommodating portions that accommodate electronic components and that are formed in a longitudinal direction,
    wherein a plurality of protrusions are disposed at the bottom portions of the accommodating portions so as to protrude in an outward direction of the bottom portions and so as to be separated from each other in the longitudinal direction of the carrier tape,
    wherein surfaces of interval portions provided between the accommodating portions are disposed lower than surfaces of both ends of the carrier tape in a transverse direction thereof, and
    wherein the length of each interval portion protruding downward from both ends of the carrier tape in the transverse direction thereof is greater than or equal to the length of each protrusion protruding downward from the bottom surface of the accommodating portion.

6. A carrier tape having a plurality of recessed accommodating portions that accommodate electronic components and that are formed in a longitudinal direction,
    wherein a plurality of protrusions are disposed at the bottom portions of the accommodating portions so as to protrude in an outward direction of the bottom portions and so as to be separated from each other in the longitudinal direction of the carrier tape,
    wherein surfaces of interval portions provided between the accommodating portions are disposed lower than surfaces of both ends of the carrier tape in a transverse direction thereof, and
    wherein the bottom surfaces of the accommodating portions are provided with protruding ribs formed by inwardly bending the accommodating portions along four side surfaces of the respective accommodating portions.

7. The carrier tape according to claim 6, wherein the length between the rib that is formed in one of the accommodating portions in the transverse direction of the carrier tape and the rib that is formed in the accommodating portion adjacent to said one of the accommodating ribs and that faces the rib in said one of the accommodating portions through the interval portion is longer than the widthwise lengths of the protrusions in the longitudinal direction of the carrier tape.

8. An electronic-component accommodating member comprising a carrier tape having a plurality of recessed accommodating portions that accommodate electronic components and that are formed in a longitudinal direction, electronic components that are accommodated in the accommodating portions, a cover tape that covers the accommodating portions of the carrier tape, and a reel upon which the carrier tape is wound up, wherein a plurality of protrusions are disposed at the bottom portions of the accommodating portions of the carrier tape so as to protrude in an outward direction of the bottom portions and so as to be separated from each other in the longitudinal direction of the carrier tape, wherein surfaces of interval portions provided between the accommodating portions are disposed lower than surfaces of both ends of the carrier tape in a transverse direction thereof, and wherein the plurality of protrusions include first protrusions and second protrusions, each first protrusion being formed in the center of the corresponding accommodating portion, the second protrusions being formed on the left and right of the corresponding first protrusion in the longitudinal direction of the carrier tape.

9. The electronic-component accommodating member according to claim 8, wherein the length of each first protrusion in a widthwise direction of the carrier tape and the length of each second protrusion in the widthwise direction of the carrier tape are shorter than the length of each interval portion in the widthwise direction of the carrier tape.

10. The electronic-component accommodating member according to claim 8, wherein the lengths in the widthwise direction of the carrier tape of the second protrusions that are adjacent to each other are uniform so as to uniformly press the electronic component in the accommodating portion by the second protrusions.

11. The electronic-component accommodating member according to claim 8, wherein the second protrusions are arranged between the first protrusions and the interval portions so as to press the electronic component in the accommodating portion by the first or the second protrusions, when the carrier tape is wound up.

12. An electronic-component accommodating member comprising a carrier tape having a plurality of recessed accommodating portions that accommodate electronic components and that are formed in a longitudinal direction, electronic components that are accommodated in the accommodating portions, a cover tape that covers the accommodating portions of the carrier tape, and a reel upon which the carrier tape is wound up, wherein a plurality of protrusions are disposed at the bottom portions of the accommodating portions of the carrier tape so as to protrude in an outward direction of the bottom portions and so as to be separated from each other in the longitudinal direction of the carrier tape, wherein surfaces of interval portions provided between the accommodating portions are disposed lower than surfaces of both ends of the carrier tape in a transverse direction thereof, and wherein the length of each interval portion protruding downward from both ends of the carrier tape in the transverse direction thereof is greater than or equal to the length of each protrusion protruding downward from the bottom surface of the accommodating portion.

13. An electronic-component accommodating member comprising a carrier tape having a plurality of recessed accommodating portions that accommodate electronic components and that are formed in a longitudinal direction, electronic components that are accommodated in the accommodating portions, a cover tape that covers the accommodating portions of the carrier tape, and a reel upon which the carrier tape is wound up, wherein a plurality of protrusions are disposed at the bottom portions of the accommodating portions of the carrier tape so as to protrude in an outward direction of the bottom portions and so as to be separated from each other in the longitudinal direction of the carrier tape, wherein surfaces of interval portions provided between the accommodating portions are disposed lower than surfaces of both ends of the carrier tape in a transverse direction thereof, and wherein the bottom surfaces of the accommodating portions are provided with protruding ribs formed by inwardly bending the accommodating portions along four side surfaces of the respective accommodating portions.

14. The electronic-component accommodating member according to claim 13, wherein the length between the rib that is formed in one of the accommodating portions in the transverse direction of the carrier tape and the rib that is formed in the accommodating portion adjacent to said one of the accommodating ribs and that faces the rib in said one of the accommodating portions through the interval portion is longer than the widthwise lengths of the protrusions in the longitudinal direction of the carrier tape.

15. A method of transporting electronic components comprising:

accommodating the electronic components in accommodating portions of a carrier tape, the accommodating portions accommodating the electronic components and being formed in a longitudinal direction;

covering the accommodating portions of the carrier tape with a cover tape;

forming an electronic-component accommodating member as a result of winding the carrier tape covered with the cover tape upon a reel so that the accommodating portions are at the inner side; and transporting the electronic-component accommodating member, wherein a plurality of protrusions are disposed at the bottom portions of the accommodating portions of the carrier tape so as to protrude in an outward direction of the bottom portions and so as to be separated from each other in the longitudinal direction of the carrier tape, and wherein surfaces of interval portions provided between the accommodating portions are disposed lower than surfaces of both ends of the carrier tape in a transverse direction thereof, and wherein the plurality of protrusions include first protrusions and second protrusions, each first protrusion being formed in the center of the corresponding accommodating portion, the second protrusions being formed on the left and right of the corresponding first protrusion in the longitudinal direction of the carrier tape.

* * * * *